US 8,056,795 B2

(12) United States Patent
Peterson

(10) Patent No.: US 8,056,795 B2
(45) Date of Patent: Nov. 15, 2011

(54) FLUXOMETER WITH A COVER HAVING PROTRUSIONS

(75) Inventor: Corey A. Peterson, Grafton, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 46 days.

(21) Appl. No.: 12/511,951

(22) Filed: Jul. 29, 2009

(65) Prior Publication Data
US 2011/0024482 A1    Feb. 3, 2011

(51) Int. Cl.
*B23K 1/00* (2006.01)
*B23K 5/00* (2006.01)
*G01N 11/00* (2006.01)

(52) U.S. Cl. .............................. 228/33; 228/57; 73/53.01
(58) Field of Classification Search .......... 228/101–105, 228/33, 57; 73/53.01; 382/152; 427/8
See application file for complete search history.

(56) References Cited

U.S. PATENT DOCUMENTS

| | | | | |
|---|---|---|---|---|
| 5,560,537 | A * | 10/1996 | Sadler et al. | 228/102 |
| 6,321,591 | B1 * | 11/2001 | Breunsbach et al. | 73/53.01 |
| 6,952,046 | B2 * | 10/2005 | Farrell et al. | 257/678 |
| 2002/0179690 | A1 | 12/2002 | Kawashima et al. | |

OTHER PUBLICATIONS

"Fluxometer. Spray flux uniformity measurement system." ECD May 31, 2007; XP002602666; Retrieved from the Internet: URL:http//www.dilectro.com/site/images/stories/ecd/fluxometer-fiche-ecd.pdf [retrieved on Sep. 27, 2010].
"Fluxometer. Quick reference guide." ECD Apr. 14, 2009, XP002602667; Retrieved from the Internet: URL:http://www.ecd.com/products/fluxometer/downloads/fluxometer_qrg.pdf [retrieved on Sep. 28, 2010].
European Search Report & Written Opinion, Application No. EP 10 17 1258, Sep. 29, 2010.

* cited by examiner

*Primary Examiner* — Kiley Stoner
*Assistant Examiner* — Carlos Gamino
(74) *Attorney, Agent, or Firm* — Fletcher Yoder, P.C.; Alexander R. Kuszewski; John M. Miller

(57) ABSTRACT

A fluxometer system and method is provided. The fluxometer comprises a frame, a simulated circuit board disposed in the frame and having a plurality of holes formed therein extending generally transverse to a plane of the board and a cover. The cover is received on the frame over the simulated circuit board and includes several protrusions simulating leads that extend into the holes of the simulated circuit board. The fluxometer further includes an indicator sheet disposed between the simulated circuit board and the cover, the protrusions extending through the indicator sheet.

16 Claims, 4 Drawing Sheets

FLUXOMETER WITH A COVER HAVING PROTRUSIONS

BACKGROUND

The invention relates generally to wave solder systems, and more specifically to a fluxometer used for monitoring flux deposition.

Wave soldering is a common method of forming solder joints between electronic components and circuit traces on a printed circuit board (PCB). Typically, electronic components are placed on the PCB and their leads are inserted into holes in the circuit board such that the leads are in contact with metal pads or plating on vias to which they are eventually soldered.

A typical automatic wave soldering system includes conveyors driven to move the PCB at a constant speed from an entrance to an exit end of the system. The board is first carried to a fluxer where a spray of flux is applied to the bottom of the board. The PCB is then carried over heaters to evaporate excess flux deposits, activate the flux and minimize thermal shock. After the PCB is heated to a desired temperature, the board is passed over a solder pot to receive solder. The board is finally transported to a cool down zone where the solder is cooled and solidifies.

To ensure that all component leads are appropriately soldered, flux should be appropriately deposited such that it coats each component lead hole on the PCB even with the presence of leads of the electronic components. In general, components tend to solder better when the amount of flux deposited in the holes is sufficient. When the holes are partially coated, the boards may pass a testing stage but in time one or more of the component leads breaks away from the board due to poor soldering.

Several parameters of the fluxer are therefore set to ensure that flux is sprayed on to the PCB such that it properly contacts and/or fills each hole or via. Examples of fluxer parameters include atomization of the flux, a driving force of the fluxer spray, speed of a spray head of the fluxer, etc. The amount of flux deposition on the holes of the PCB directly depends on these fluxer parameters.

Typically, fluxer parameters are adjusted by testing a batch of PCBs that are first soldered using a set of fluxer parameters and subsequently making adjustments to the fluxer parameters based on the test results. This technique however is time consuming, expensive and may not render accurate settings for the fluxer. Fluxometers have been developed for testing application of flux to the desired regions of the board, but these are generally ineffective at accurately simulating and evaluating flux coverage.

Therefore, there is a need for a method and system to accurately set the parameters of the fluxer to ensure that the flux is appropriately deposited on printed circuit boards.

BRIEF DESCRIPTION

Briefly, according to one embodiment of the invention a fluxometer is provided. The fluxometer comprises a frame, a simulated circuit board disposed in the frame and having a plurality of holes formed therein extending generally transverse to a plane of the board, and a cover received on the frame over the simulated circuit board, the cover having a plurality of protrusions simulating leads that extend into the holes of the simulated circuit board.

In another embodiment, a fluxometer comprises a frame, a simulated circuit board disposed in the frame and having a plurality of holes formed therein extending generally transverse to a plane of the board and a cover received on the frame over the simulated circuit board. The cover includes a plurality of protrusions simulating leads that extend into the holes of the simulated circuit board. The fluxometer further comprises an indicator sheet disposed between the simulated circuit board and the cover, with the protrusions extending through the indicator sheet.

In another embodiment, a method for verifying operation of a fluxer in a wave solder process is provided. The method comprising disposing an indicator sheet between a simulated circuit board and a cover, the cover having a plurality of protrusions extending therefrom and configured to enter into holes formed in the simulated circuit board, applying pressure on the cover onto the indicator sheet and the simulated circuit board to force the protrusions to pierce the indicator sheet and to enter into the holes. The method further comprises performing a fluxer test by applying flux to a side of the simulated circuit board opposite the cover.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
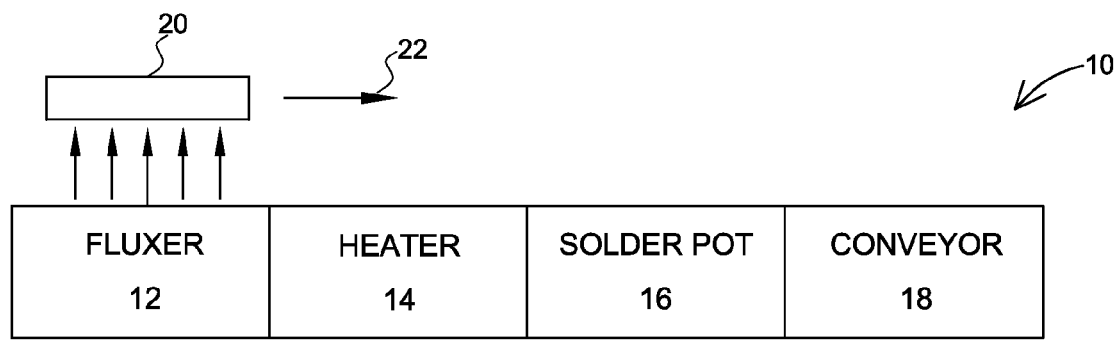
FIG. 1 is a block diagram of one embodiment of wave solder system implemented according to one aspect of the invention.

Turning now to the drawings, and referring first to FIG. 1, a wave solder system 10 for soldering electronic components on printed circuit board (PCB) 20 is illustrated. The system includes fluxer 12, heater 14, solder pot 16 and conveyor 18. The PCB moves in the direction indicated by reference numeral 22 from the fluxer towards the solder pot. Each block is described in further detail below.

Fluxer 12 is configured to deposit flux on a bottom side of the PCB. In one embodiment, the fluxer is configured to spray the flux on to a bottom side of the PCB. The manner in which flux is sprayed on to the PCB depends on certain parameters that are set on the fluxer. These parameters include atomization of the fluxer, a driving force of the fluxer spray, the speed of a spray head, etc.

As used herein, "flux" refers to a solid, gas or liquid agent that promotes the formation of solder joints through removal of surface oxides on the metallic surfaces to be soldered. Typically, flux used with lead based or lead free solder is in liquid form however, flux may also be applied in powder or granular form, or in a gaseous form such as a reducing gas to reduce surface oxides.

Heater 14 is configured to preheat the PCB 20 to dry and activate the flux and to thermally prepare the PCB to receive molten solder from solder pot 16 with low thermal stress. The bottom of the fluxed, preheated PCB then moves over solder pot 16 and receives molten solder. Upon solidification of the solder, electrically conductive joints are formed between the electrical components disposed within the PCB.

Conveyor 18 is configured to sequentially move PCB 20 from the fluxer to the heater and then to a solder pot. In one embodiment, the conveyor can be programmed to move the PCB from one area of the wave solder system to the next at predetermined intervals of time. In one embodiment, flux deposition by the flux depends on a speed of the conveyor.

Figure 2:
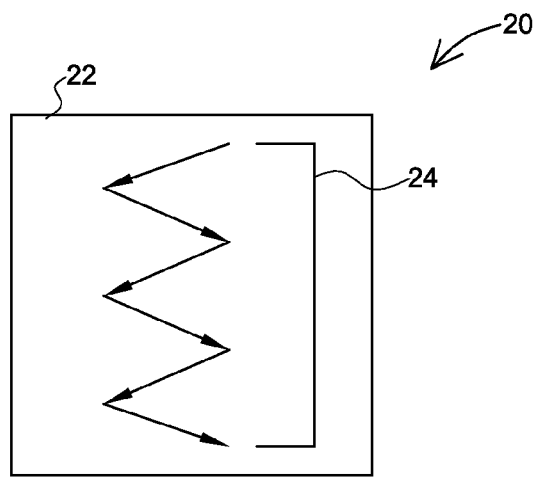
FIG. 2 is a diagrammatic view of a flux deposit pattern on a printed circuit board implemented according to one aspect of the invention.

As discussed above, fluxer 12 is configured to spray flux on a bottom side of the PCB 20. The manner in which the flux is sprayed on to the PCB is described in further detail with reference to FIG. 2 and FIG. 3. FIG. 2 is a diagrammatic view of one example of a flux deposit pattern on a printed circuit board. In the illustrated embodiment, the flux is deposited in a zigzag pattern 24 on a bottom side 22 of the PCB 20.

Figure 3:
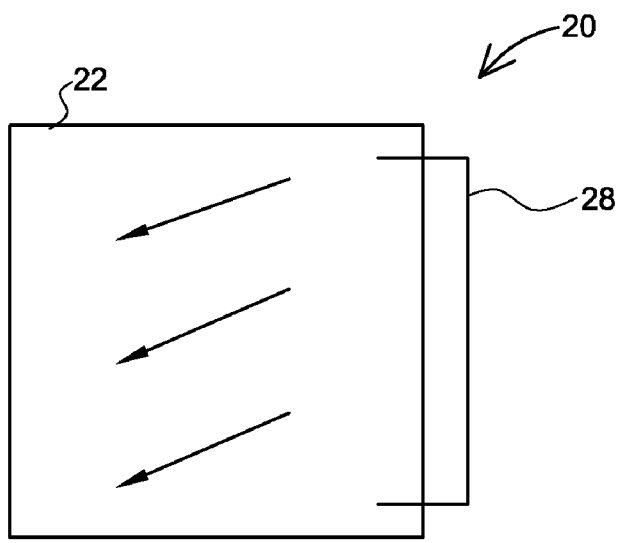
FIG. 3 is a diagrammatic view of a flux deposit pattern on a printed circuit board implemented according to one aspect of the invention.

FIG. 3 is a diagrammatic view of another example of a flux deposit pattern on a printed circuit board. The flux is deposited in diagonal lines 28 on a bottom side 22 of the PCB 20. In order to ensure that flux is appropriately deposited on the PCB during the wave solder process, certain parameters of the fluxer needs to be set and/or adjusted.

A fluxometer is used to monitor flux deposits sprayed by a fluxer (with preset parameters) and then making necessary adjustments to the fluxer before printed circuit boards are soldered using the wave solder system. The fluxometer includes a simulated circuit board disposed within a frame, and a cover several protrusions that simulates the component leads. The fluxometer is described in further detail below with reference to FIG. 4.

Figure 4:
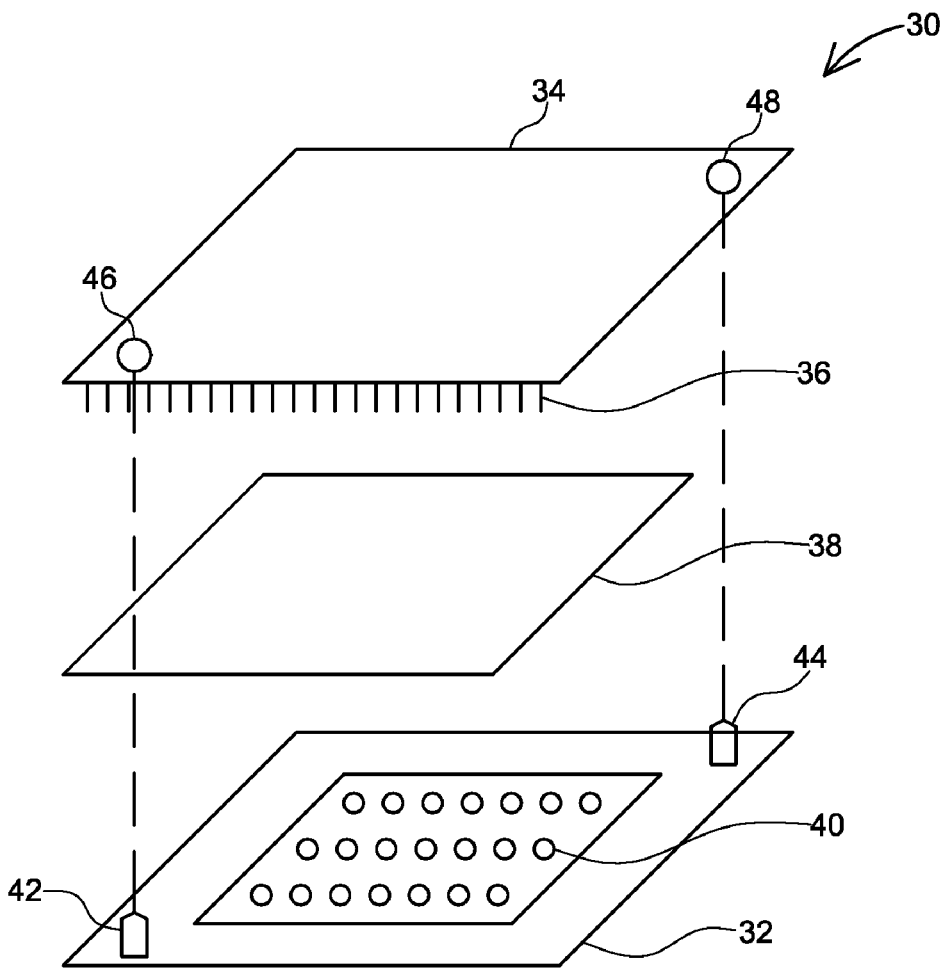
FIG. 4 is an exploded view of one embodiment of a fluxometer implemented according to one aspect of the invention.

FIG. 4 is an exploded view of one embodiment of a fluxometer implemented according to one aspect of the invention. Fluxometer 30 comprises a frame 32 including a simulated circuit board 40 and a cover 34 received on the frame. The fluxometer receives flux deposits on the simulated circuit board. Each component is described in further detail below.

Simulated circuit board 40 is disposed within the frame. The simulated circuit board includes holes 40 formed therein extending generally transverse to a plane of the board. In one embodiment, the holes in the simulated circuit board are substantially identical. In one embodiment, the simulated circuit board includes more than 5000 holes. In a specific embodiment, the simulated circuit board comprises approximately 8000 holes. Any suitable number and configuration of holes may be provided, however, depending upon the anticipated configuration of the circuit boards to be processed.

Cover 34 is received on the frame over the simulated circuit board. In one embodiment, the cover comprises plurality of protrusions 36 that simulate component leads. The protrusions are configured to extend into the holes of the simulated circuit board similar to the manner in which component leads extend into holes of a printed circuit board. In one presently contemplated embodiment, the cover is made of fiberglass.

The protrusions on the cover may have different lengths and thicknesses. The different thickness of the protrusions creates different annular areas between the protrusions and the inner surfaces of the holes. In one embodiment, the number of protrusions on the cover is substantially equal to the number of holes in the simulated circuit board.

Indicator sheet 38 is disposed between the simulated circuit board and the cover. When the cover is placed on the frame, the protrusions of the cover extend through the indicator sheet. In one embodiment, the indicator sheet is litmus paper. When the cover is placed over the frame, pressure is applied on the cover, the indicator sheet and the simulated circuit board to force the protrusions to pierce the indicator sheet and to enter into the holes.

Guide pins 42 and 44 extend from the frame into guide holes 46 and 48 respectively formed on the cover 34. By guiding the guide pins through the guide holes, the cover is firmly secured to the frame of the frame, and the pins are guided into the holes in the simulated circuit board. Once the cover is firmly secured to the frame, flux is applied the simulated circuit board on the side that is opposite to the cover (e.g., by running the fluxometer through the fluxer with the process settings input as they would be for production, or adjusted as desired.

After application of the flux, the cover is removed from the frame and the indicator sheet is examined to determine whether the flux has moved up the barrel of each of the hole and made contact with the indicator sheet. Upon examination of the indicator sheet, necessary adjustments may be made to the fluxer before the PCBs are passed through the wave solder system for soldering.

Since the cover of the fluxometer has several protrusions that extend into the holes of the simulated circuit board, flux will not easily move up the barrel each hole unless the fluxer parameters are appropriately set. The cover of the fluxometer is described in further detail below with reference to FIG. 5 and FIG. 6.

Figure 5:
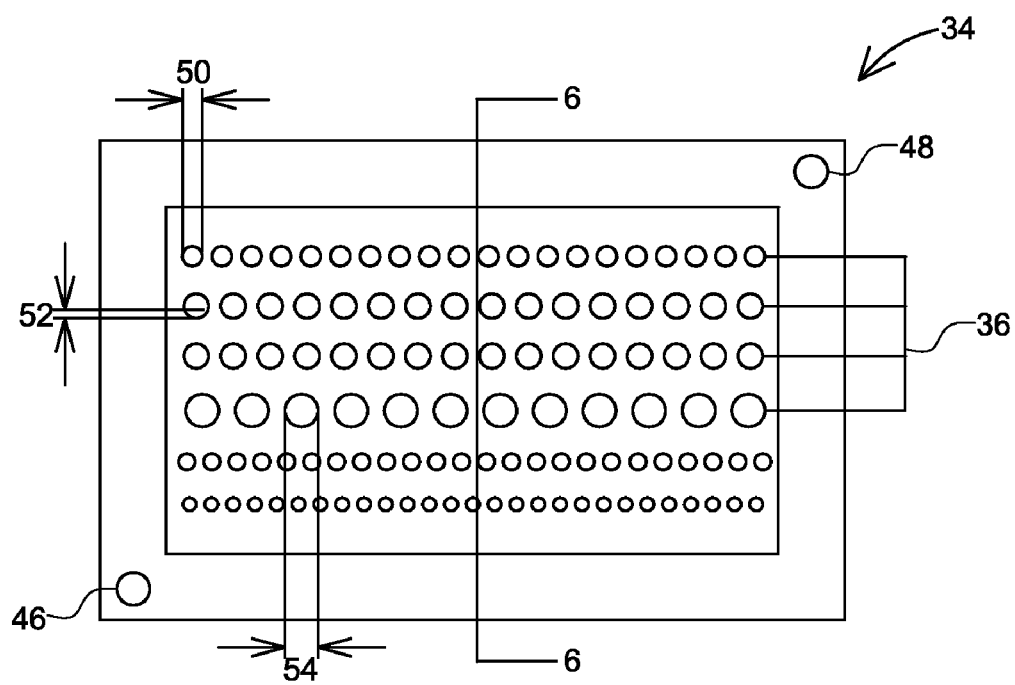
FIG. 5 is a bottom view of a cover of a fluxometer implemented according to one aspect of the invention.

FIG. 5 is a bottom view of a cover of a fluxometer implemented according to one aspect of the invention. The cover comprises a plurality of protrusions 36 and guide holes 46 and 48. The protrusions are of different diameters 50, 52 and 56. In one embodiment, the diameters vary from 0.015 to 0.035 inches. Similarly, the length of each protrusion may also vary as shown in FIG. 6.

Figure 6:
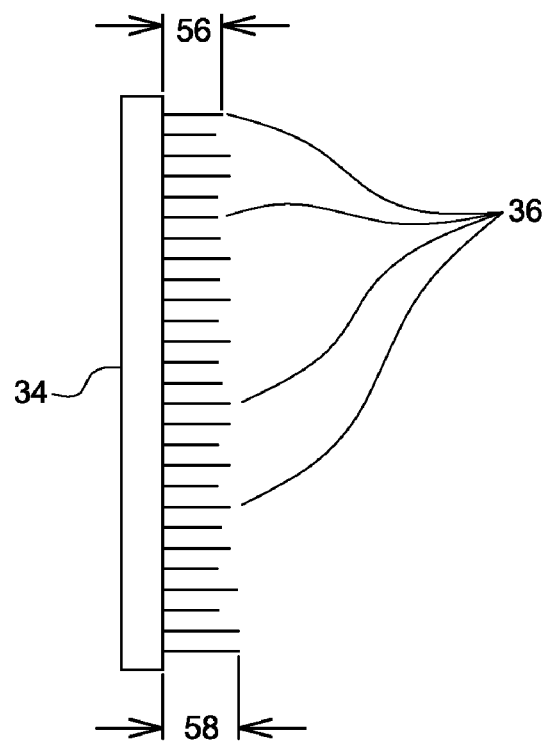
FIG. 6 is a side view of a cover of a fluxometer implemented according to one aspect of the invention.

FIG. 6 is a side view of a cover of a fluxometer implemented according to one aspect of the invention. Protrusions 36 are of different lengths as shown by 56 and 58 respectively. In one embodiment, the lengths vary from 0.077 to 0.155 inches. Examples of protrusions with different lengths and different diameters are illustrated in further detail in FIG. 7 and FIG. 8.

Figure 7:
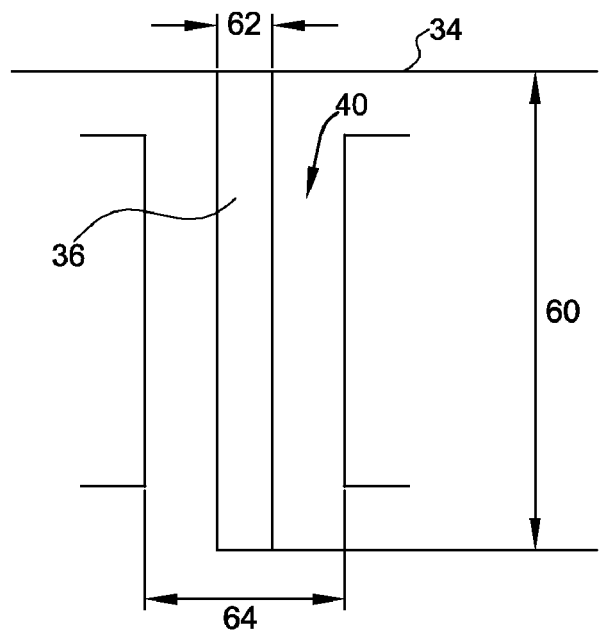
FIG. 7 and FIG. 8 are cross-sectional views of protrusions on a cover of the fluxometer received through one hole of a simulated circuit board.
Figure 8:
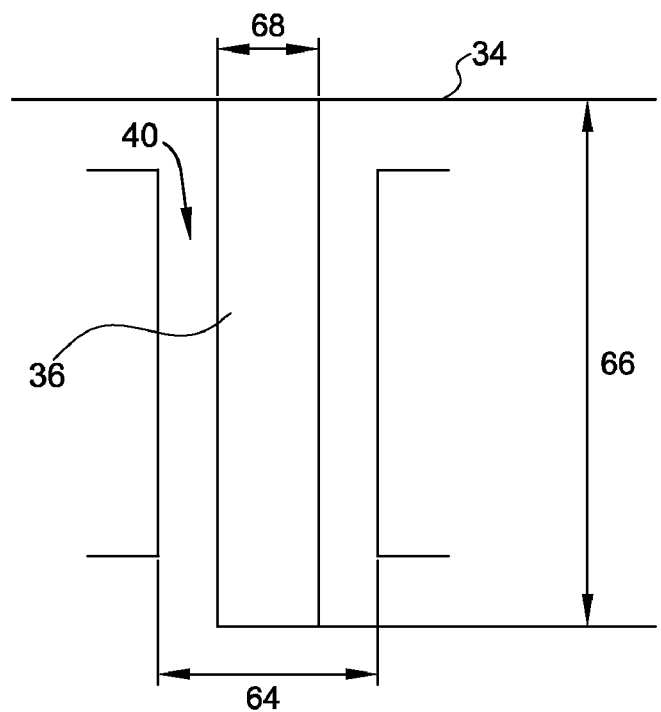

In FIG. 7, the length of protrusion 36 is represented by reference numeral 60 and its diameter is represented by reference numeral 62. The diameter of hole 40 is represented by reference numeral 64. Similarly in FIG. 8, length of protrusion 36 is represented by reference numeral 66 and its diameter is represented by reference numeral 68. The diameter of hole 40 is represented by reference numeral 64. As is seen in FIG. 7 and FIG. 8, the length and diameter of the protrusion is different while the diameter of the hole is equal.

When the cover is secured on the frame, the different thickness protrusion creates different annular areas between the protrusions and inner surfaces of the holes since the sizes of the holes in the simulated circuit board are substantially identical. It should be noted that simulated circuit boards may be configured differently, such as with holes of different sizes, and combinations of differently sized holes and different simulated leads may be used to test performance of the fluxer in such different structures.

The above described techniques provide several advantages including delivering printed circuit boards which require substantially lesser solder joint touchup. In addition, the time required to set up the fluxer parameters is also reduced. The fluxometer as described above is configured to set the fluxer parameters accurately before the printed circuit boards are passed through the wave solder system.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A device for verifying operation of a fluxer comprising:
    a frame;
    a simulated circuit board disposed in the frame and having a plurality of holes formed therein extending generally transverse to a plane of the board; and
    a cover received on the frame over the simulated circuit board, the cover having a plurality of protrusions simulating leads that extend into the holes of the simulated circuit board.

2. The device of claim 1, wherein the protrusions have different lengths.

3. The device of claim 1, wherein the protrusions have different thicknesses.

4. The device of claim 3, wherein the holes in the simulated circuit board are substantially identical, the different thickness protrusions creating different annular areas between the protrusions and inner surfaces of the holes.

5. The device of claim 1, further comprising an indicator sheet disposed between the simulated circuit board and the cover, the protrusions of the cover extending through the indicator sheet.

6. The device of claim 5, wherein the indicator sheet is litmus paper.

7. The device of claim 1, further comprising at least one guide pin extending from the frame and a guide hole formed in the cover, the guide pin being received in the guide hole to guide the cover into place on the simulated circuit board.

8. The device of claim 1, comprising at least approximately 5,000 holes and protrusions.

9. The device of claim 7, comprising at least approximately 8,000 holes and protrusions.

10. The device of claim 1, wherein the number of protrusions is generally the same as the number of holes.

11. A device for verifying operation of a fluxer comprising:
    a frame;
    a simulated circuit board disposed in the frame and having a plurality of holes formed therein extending generally transverse to a plane of the board;
    a cover received on the frame over the simulated circuit board, the cover having a plurality of protrusions simulating leads that extend into the holes of the simulated circuit board; and
    an indicator sheet disposed between the simulated circuit board and the cover, the protrusions extending through the indicator sheet.

12. The device of claim 11, wherein the protrusions have different lengths.

13. The device of claim 11, wherein the protrusions have different thicknesses.

14. The device of claim 13, wherein the holes in the simulated circuit board are substantially identical, the different thickness protrusions creating different annular areas between the protrusions and inner surfaces of the holes.

15. The device of claim 11, wherein the indicator sheet is litmus paper.

16. The device of claim 11, further comprising at least one guide pin extending from the frame and a guide hole formed in the cover, the guide pin being received in the guide hole to guide the cover into place on the simulated circuit board.

* * * * *